(12) United States Patent
Ikari

(10) Patent No.: US 8,518,187 B2
(45) Date of Patent: Aug. 27, 2013

(54) TRANSFER PICK CLEANING METHOD

(75) Inventor: Hiroshi Ikari, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/397,727

(22) Filed: Feb. 16, 2012

(65) Prior Publication Data
US 2012/0145183 A1 Jun. 14, 2012

Related U.S. Application Data

(62) Division of application No. 11/691,857, filed on Mar. 27, 2007, now abandoned.

(60) Provisional application No. 60/792,960, filed on Apr. 19, 2006.

(30) Foreign Application Priority Data

Mar. 28, 2006 (JP) ................................. 2006-088624

(51) Int. Cl.
- *B08B 7/04* (2006.01)
- *B08B 6/00* (2006.01)
- *B08B 5/02* (2006.01)

(52) U.S. Cl.
USPC ............................................... 134/1; 134/30

(58) Field of Classification Search
USPC ........................................ 134/1, 18
See application file for complete search history.

(56) References Cited

U.S. PATENT DOCUMENTS

| | | | |
|---|---|---|---|
| 5,258,047 A * | 11/1993 | Tokisue et al. | 29/25.01 |
| 5,781,400 A | 7/1998 | Takahashi et al. | |
| 6,338,626 B1 | 1/2002 | Saeki | |
| 6,482,746 B2 * | 11/2002 | Vasudev et al. | 438/714 |
| 6,543,981 B1 | 4/2003 | Halsey et al. | |
| 2002/0045413 A1 | 4/2002 | Sotozaki | |
| 2005/0087136 A1 | 4/2005 | Moriya et al. | |
| 2005/0118001 A1 | 6/2005 | Yamagishi et al. | |
| 2005/0133073 A1 | 6/2005 | Krieg | |
| 2006/0011213 A1 | 1/2006 | Moriya et al. | |
| 2006/0018736 A1 | 1/2006 | Lee et al. | |
| 2009/0301516 A1 | 12/2009 | Moriya et al. | |

FOREIGN PATENT DOCUMENTS

| | | |
|---|---|---|
| EP | 790642 A2 * | 8/1997 |
| JP | 2005-116823 | 4/2005 |
| JP | 2005-317783 | 11/2005 |

* cited by examiner

*Primary Examiner* — Michael Kornakov
*Assistant Examiner* — Natasha Campbell
(74) *Attorney, Agent, or Firm* — Rothwell, Figg, Ernst & Manbeck, P.C.

(57) ABSTRACT

A transfer pick provided at a leading end of a transfer arm of a transfer device for transferring a substrate includes a substrate support surface for supporting the substrate thereon; a plurality of contact members protruded from the substrate support surface to contact with the substrate; and a voltage applying unit for charging the contact members with electricity. Further, the transfer pick has a self-cleaning function of removing particles adhered to the contact members by using repulsive force of an electric charge. In addition, a computer readable memory medium storing a computer executable control program, wherein the control program controls a substrate processing apparatus to perform the transfer pick cleaning method.

19 Claims, 7 Drawing Sheets

TRANSFER PICK CLEANING METHOD

CROSS REFERENCE TO RELATED APPLICATION

This application is a divisional application of U.S. application Ser. No. 11/691,857, filed on Mar. 27, 2007, which claims the benefit of U.S. Provisional Application 60/792,960, filed Apr. 19, 2006, and claims priority to Japanese Application No. 2006-088624, filed on Mar. 28, 2006. The entire contents of application Ser. No. 11/691,857 is hereby incorporated by reference.

FIELD OF THE INVENTION

The present invention relates to a transfer pick used to transfer a substrate, such as a semiconductor substrate, a transfer device having the transfer pick, a substrate processing apparatus having the transfer device, and a transfer pick cleaning method.

BACKGROUND OF THE INVENTION

In a typical substrate processing apparatus for performing a process, for example, an etching, a substrate such as a semiconductor wafer, a transfer device (a transfer robot), in which a transfer pick for supporting the substrate is provided on a leading end of a transfer arm, which extends and rotates in specific directions and vertically moves without restriction, is used to transfer the substrate into a processing chamber. Typically, a plurality of contact members, each of which is made of elastomer, is provided on a wafer support surface of the transfer pick. The contact members are brought into contact with the substrate to support the substrate thereon.

The contact members of the transfer pick are made of elastomer because the position of the substrate, placed on the transfer pick, can be prevented from undesirably being misaligned out of the correct position due to the adhesive force of the elastomer. However, as the substrates are repeatedly transferred, foreign particles or deposits from processed substrates get adhered to the contact members, thereby decreasing the adhesive force of the contact members made of elastomer. Given the decrease in the adhesive force, the position of the substrate on the transfer pick is made to be easily misaligned out of the correct position. As a result, the accuracy of the transfer operation is reduced, and this results in defective products. Moreover, the substrate may be dropped during the transfer operation. Furthermore, when transferring the substrate by the contact members of the transfer pick having foreign particles adhered to the contact members, the foreign particles are transferred and adhered to the rear surface of the substrate when the transfer pick is brought into close contact with the rear surface of the substrate, thus causing a problem of particle contamination for the substrates.

To avoid such a problem, an operator, in the prior art, is required to periodically clean the contact members of the transfer pick. However, by manually cleaning the contact members, additional operation time is consumed and the stoppage of the substrate processing apparatus during the cleaning process cannot be avoided. Therefore, the cleaning operation cannot be performed as many time as desired, and the above-mentioned likelihood of misalignment of substrate caused by a reduction in the adhesive force of the transfer pick still remains.

In an effort to overcome the above problems, there has been proposed a method, in which foreign particles that exist in the processing space are charged with electricity by a particle electric charging unit, and an electric field having the same polarity as that of the particles is created around a transfer arm by an electric field creating device so that the foreign particles are prevented from being adhered to a semiconductor substrate (for example, see Patent Reference 1: Japanese Patent Laid-open Publication No. 2005-116823 (e.g., paragraph 0057)).

The technique of Patent Reference 1 prevents particles from being adhered to a semiconductor substrate using the method of creating an electric field for providing repulsive force with respect to the particles around the transfer arm, but it does not consider the removal of foreign particles, which cause the substrate to be misaligned out of the correct position on the transfer pick, from the contact members of the transfer pick.

SUMMARY OF THE INVENTION

It is, therefore, an object of the present invention to provide a method of effectively removing foreign particles from contact members of a transfer pick of a transfer device to prevent a substrate supported on the transfer pick from being misaligned out of the correct position.

In accordance with an aspect of the present invention, there is provided a transfer pick provided at a leading end of a transfer arm of a transfer device for transferring a substrate, the transfer pick including: a substrate support surface for supporting the substrate thereon; a plurality of contact members protruded from the substrate support surface to contact with the substrate; and a voltage applying unit for charging the contact members with electricity, wherein the transfer pick has a self-cleaning function of removing particles adhered to the contact members by using repulsive force of an electric charge.

Further, the transfer pick may further include a conductive member and an insulation member covering the conductive member, wherein the voltage applying unit is electrically connected to the conductive member, and applies a positive or a negative voltage to the conductive member.

Further, a transfer device may include the transfer pick.

Further, a substrate processing apparatus may include a processing chamber, in which a substrate is processed; and a transfer chamber having therein a transfer device to transfer the substrate into the processing chamber, wherein the transfer device includes the transfer pick.

In accordance with another aspect of the present invention, there is provided a substrate processing apparatus including: a vacuum processing chamber, in which a substrate is processed; a transfer chamber having therein a transfer device to transfer the substrate into the vacuum processing chamber, wherein the transfer device includes a transfer arm and a transfer pick provided at a leading end of the transfer arm, the transfer pick having a plurality of contact members protruded from a substrate support surface for supporting the substrate thereon; a load lock chamber provided between the vacuum processing chamber and the transfer chamber; and an electric charging unit for supplying charged particles to the contact members to forcibly charge the contact members with electricity.

Further, the electric charging unit may apply a voltage to the contact members such that the contact members are charged with electricity having a polarity equal to that of particles adhered to the contact members.

Further, the electric charging unit may be disposed in the transfer chamber. In this case, an air stream generator and an exhaust device may be provided in the transfer chamber, the air stream generator being used for generating an air stream in the transfer chamber and the exhaust device being used for exhausting an inside of the transfer chamber, and the electric charging unit may be disposed downstream of a substrate transfer position of the transfer device in a direction of the air stream.

Further, the electric charging unit may be installed in a cleaning chamber provided adjacent to the transfer chamber. In this case, an air stream generator and an exhaust device may be provided in the cleaning chamber, the air stream generator being used for generating an air stream in the cleaning chamber and the exhaust device being used for exhausting an inside of the cleaning chamber.

Further, the electric charging unit is disposed in the load lock chamber.

In accordance with still another aspect of the present invention, there is provided a transfer pick cleaning method for use in a substrate processing apparatus including a transfer pick provided at a leading end of a transfer arm of a transfer device for transferring a substrate, the transfer pick having: a substrate support surface to support the substrate thereon; a plurality of the contact members protruded from the substrate support surface to contact with the substrate; and a voltage applying unit for charging the contact members with electricity, the transfer pick cleaning method including a cleaning process of repeatedly and alternately applying a positive and a negative voltage to the contact members by using the voltage applying unit to thereby forcibly charge the contact members such that an electric polarity thereof is repeatedly switched between a positive and a negative polarity, wherein particles adhered to the contact members are removed by repulsive force of electric charges.

In accordance with still another aspect of the present invention, there is provided a transfer pick cleaning method for use in a substrate processing apparatus including a transfer pick provided at a leading end of a transfer arm of a transfer device for transferring a substrate, the transfer pick having: a substrate support surface to support the substrate thereon; and a plurality of contact members protruded from the substrate support surface to contact with the substrate, the transfer pick cleaning method including a cleaning process of forcibly charging the contact members with electricity by using an electric charging unit supplying charged particles to contact members such that an electric polarity of the contact members is repeatedly switched between a positive and a negative polarity, thereby removing particles adhered to the contact members by repulsive force of electric charges.

Further, the cleaning process may be performed during a time period in which the transfer device of the substrate processing apparatus is idle. In addition, an air stream may be generated by an air stream generator in a chamber at which the transfer pick is provided during the cleaning process.

Further, the substrate processing apparatus may include a vacuum processing chamber, in which a substrate is processed; a transfer chamber having therein the transfer device to transfer the substrate into the processing chamber; and a load lock chamber, provided between the vacuum processing chamber and the transfer chamber, wherein the cleaning process is performed in the transfer chamber or the load lock chamber.

The transfer pick cleaning method may further include, after the cleaning process, a process of controlling a charged state of the contact members.

In accordance with still another aspect of the present invention, there is provided a computer executable control program for controlling, when executed, a substrate processing apparatus to perform the transfer pick cleaning method.

In accordance with still another aspect of the present invention, there is provided a computer readable memory medium storing a computer executable control program, wherein the control program controls a substrate processing apparatus to perform the transfer pick cleaning method.

In accordance with the present invention, an operation of cleaning the pick is easily performed in a short period of time, unlike the conventional arts, in which the cleaning operation must be periodically performed manually. Therefore, it is feasible to effectively maintain the clean state of the contact members of the transfer pick, thus preventing the contact members from being misaligned out of the correct position due to the adhesion of foreign particles to the contact members, or from being dropped during a transfer process. As a result, the proportion of defective products attributable to the reduced accuracy of the transfer operation is markedly reduced, and the reliability is increased.

Further, because the transfer pick can be maintained in the clean state with the cleaning operation, the substrate is prevented from being contaminated by foreign particles.

In addition, because the process of cleaning the transfer pick can be performed in a short period of time, the cleaning process may be performed, for example, during a stand-by state of the transfer device, and thus downtime of the substrate processing apparatus can be reduced, thereby enhancing the efficiency of the substrate processing operation.

BRIEF DESCRIPTION OF THE DRAWINGS

The above and other objects and features of the present invention will become apparent from the following description of preferred embodiments given with reference to the accompanying drawings, in which.

DETAILED DESCRIPTION OF THE EMBODIMENTS

Figure 1:
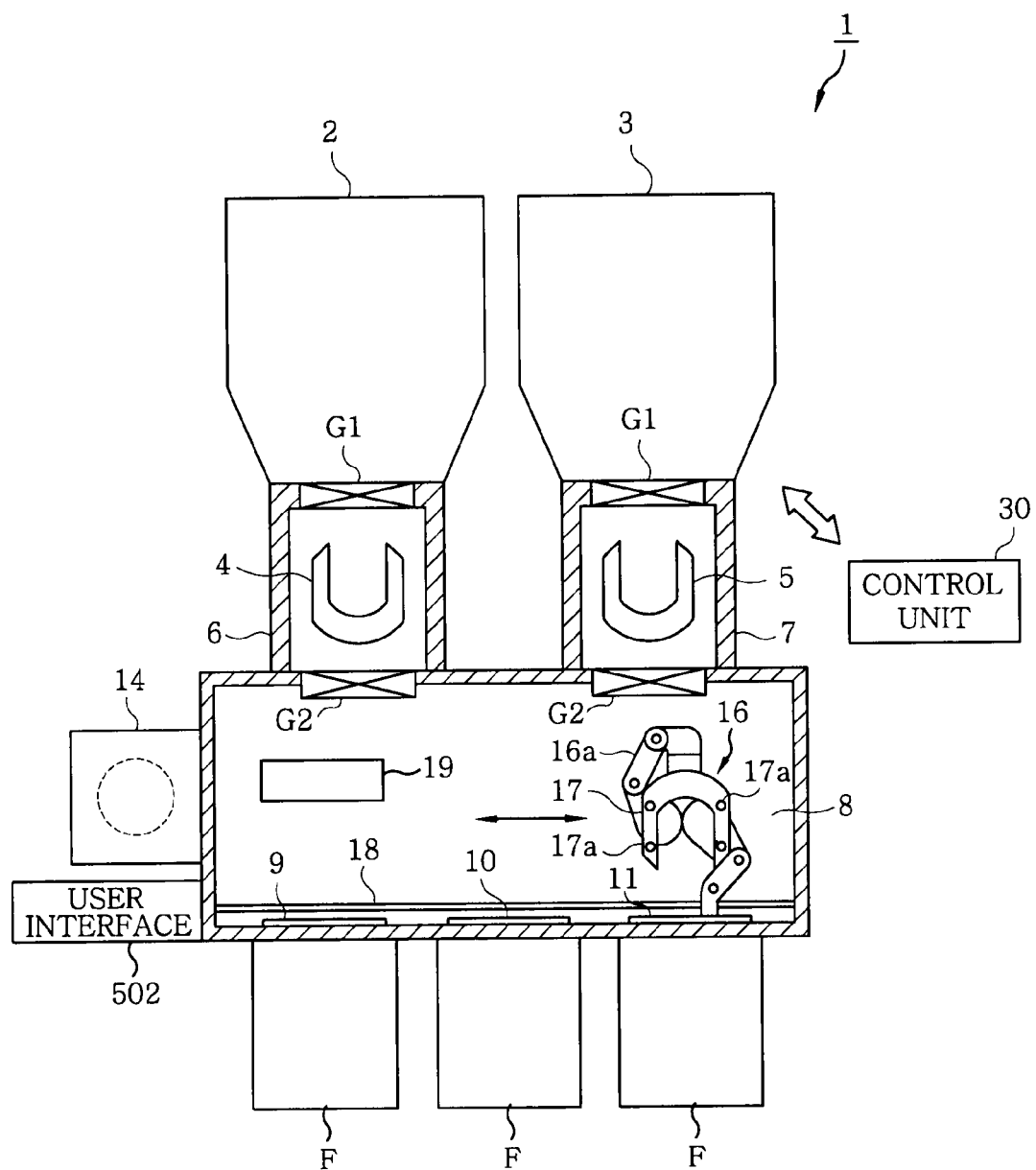
FIG. 1 shows the schematic construction of an embodiment of a plasma processing device in accordance with an embodiment of the present invention.

Hereinafter, embodiments of the present invention will be described in detail with reference to the accompanying drawings. FIG. 1 is a schematic horizontal sectional view showing a plasma processing device of a substrate processing apparatus in accordance with an embodiment of the present invention. The plasma process device 1 serves to process, for example, etch a semiconductor wafer W (hereinafter, referred to simply as "wafer"), which is the target substrate, under a specific vacuum level.

Figure 2:
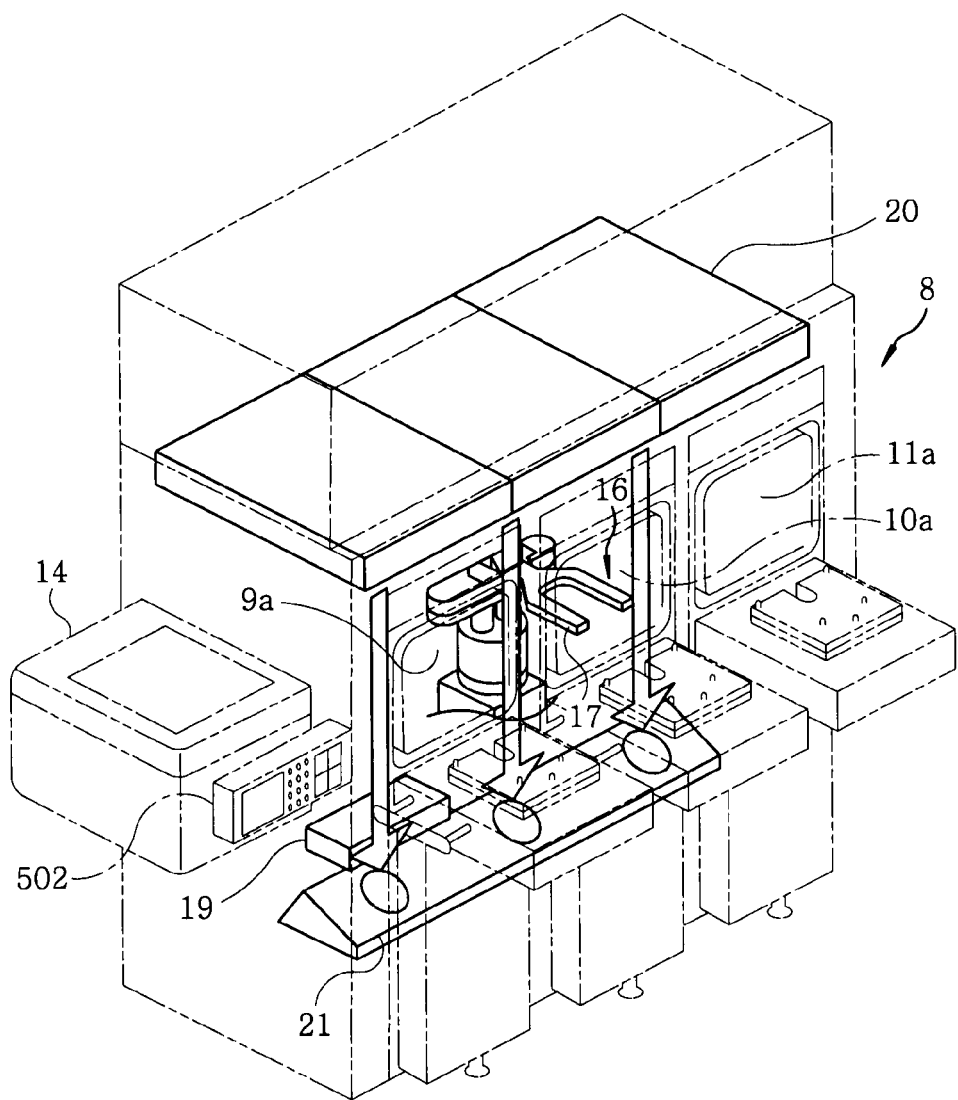
FIG. 2 is a view illustrating the internal construction of a wafer accessing chamber in accordance with the embodiment of the present invention.

The plasma processing device 1 includes two processing units 2 and 3, and is constructed such that each of the processing units 2 and 3 can independently perform the etching process on the wafer W. Load lock chambers 6 and 7 are coupled to the processing units 2 and 3, respectively, via gate valves G1. A wafer accessing chamber 8, which is a conveyance chamber, is provided at the ends of the load lock chambers 6 and 7 that are opposite of the process units 2 and 3. Three connection ports 9, 10 and 11, to each of which a FOUP (front opening unified pod) F for receiving wafers W therein is attached, are provided on the surface of the wafer accessing chamber 8 that is opposite the load lock chambers 6 and 7. The internal construction of the wafer accessing chamber 8 is shown in FIG. 2. In FIG. 2, the FOUPs F are omitted for convenience of description.

When each of the gate valves G1 is opened, each of the processing units 2 and 3 communicates with a respective load lock chambers 6 and 7. When each of the gate valves G1 is closed, each of the processing units 2 and 3 is disconnected from the respective load lock chambers 6 and 7, respectively. Furthermore, one of the gate valves G2 is provided in the junction between the wafer accessing chamber 8 and each of the load lock chambers 6 and 7, so that, when the gate G2 is opened, the load lock chambers 6 and 7 communicate with the wafer accessing chamber 8. Further, when the gate G2 is closed, the load lock chambers 6 and 7 are disconnected from the wafer accessing chamber 8.

Furthermore, wafer transfer units 4 and 5 for carrying the wafers W in or out between the wafer accessing chamber 8 and the load lock chambers 6 and 7 are disposed in the load lock chambers 6 and 7, respectively.

The three connection ports 9, 10 and 11 of the wafer accessing chamber 8 for mounting the FOUPs F are provided, respectively, with shutters 9a, 10a and 11a (see FIG. 2). A FOUP F having wafers W therein, or an empty FOUP F is directly mounted to each of the connection ports 9, 10 and 11. Here, shutters 9a, 10a and 11a are removed from the connection ports 9, 10 and 11, respectively, when the FOUP F is mounted thereto, so that the outside air is prevented from entering the wafer accessing chamber 8 when the FOUP F communicates with the wafer accessing chamber 8. Furthermore, an alignment chamber 14 for aligning the wafers W is provided on an end of the wafer accessing chamber 8.

A wafer transfer device 16 for carrying the wafers W into or out of the FOUPs F and the wafers W into or out of the load lock chambers 6 and 7 is provided in the wafer accessing chamber 8. The wafer transfer device 16 is movable along a rail 18 in the direction in which the FOUPs F are arranged. Further, the wafer transfer device 16 includes a multi-joint arm 16a and a transfer pick 17, which is provided on the front end of the multi-joint arm 16a to hold a wafer W. Thus, the wafer W is loaded on the transfer pick 17 to be carried. The transfer pick 17 is made of ceramic material such as alumina ($Al_2O_3$). A plurality of contact members 17a, for example, four contact members 17a, which are configured to be contacted with a wafer W, are protruded from the support surface of the transfer pick 17 on which the wafer W is supported. Each contact member 17a is made of elastomer material such as silicone resin or the like. The transfer pick 17 supports the wafer W using the adhesive force of the contact members 17a such that the wafer W is prevented from being misaligned out of the correct position on the transfer pick 17, or from being dropped.

Furthermore, an ion generator 19, which supplies charged particles (ions) to the transfer pick 17 to charge the transfer pick 17 with electricity, is provided in the wafer accessing chamber 8. A typical ionizer may be used as the ion generator 19.

In addition, a FFU (fan filter unit) 20, which servers as an air stream generator, is provided in the ceiling of the wafer accessing chamber 8. An exhaust fan unit (EFU) 21, which faces the FFU 20, is provided around the bottom in the wafer accessing chamber 8. As shown by the arrows of FIG. 2, clean air is supplied downwards into the wafer accessing chamber 8 by the FFU 20 and is exhausted outside by the exhaust fan unit 21. Thus, the process of carrying in or out the wafers W can be performed under an atmospheric pressure of +1.3 Pa or higher of clean air. The ion generator 19 may be disposed between the FFU 20 and the exhaust fan unit 21 at downstream of a substrate transfer position of the transfer device in a direction of the air stream.

The plasma processing device 1 includes a user interface 502, which is provided on the end of the wafer accessing chamber 8. The user interface 502 has an input unit (a keyboard) and a display unit (a monitor) such as, for example, an LCD (liquid crystal display). The display unit displays the operating conditions of the elements of the plasma processing device 1.

Figure 3:
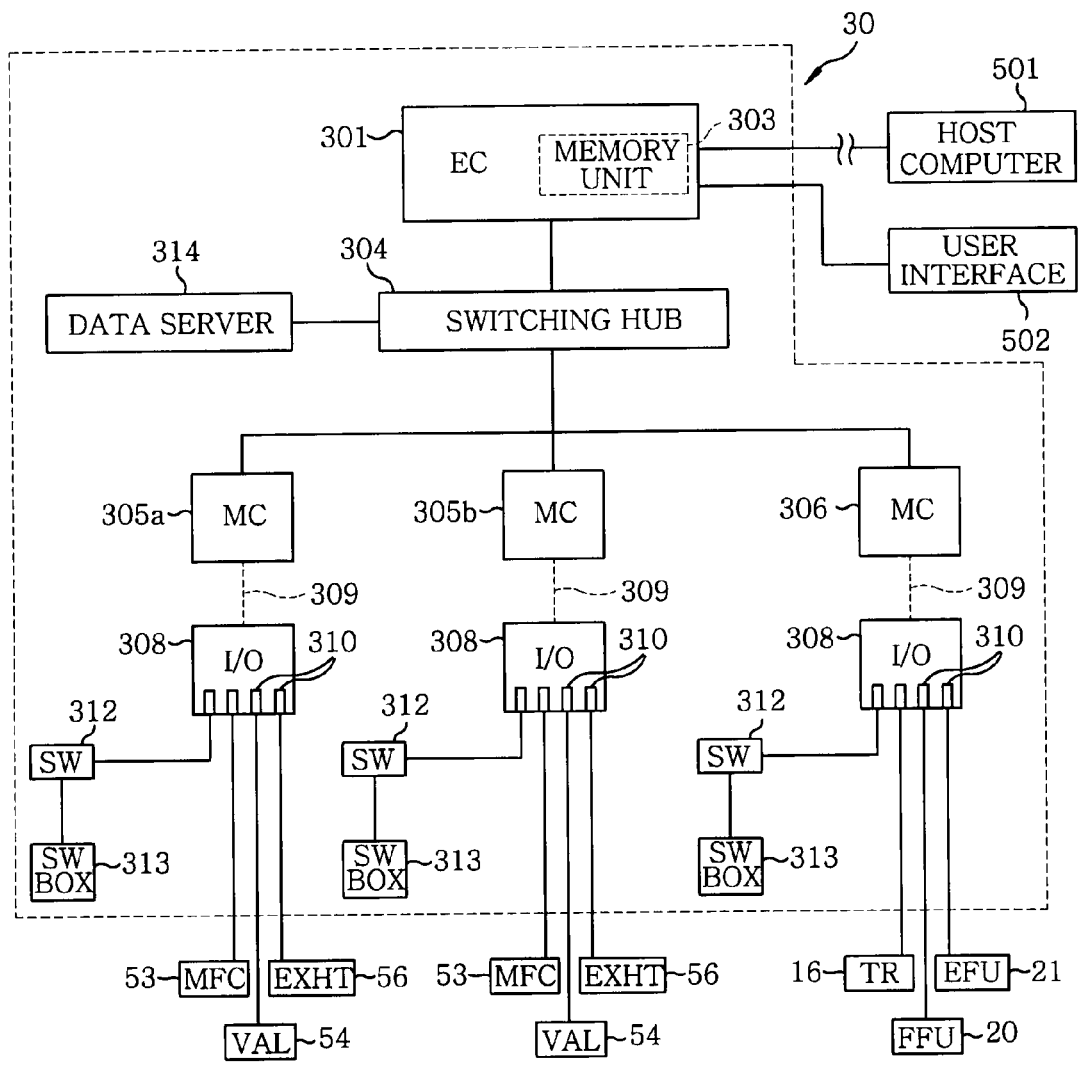
FIG. 3 depicts the schematic construction of a control unit in accordance with the embodiment of the present invention.

Furthermore, a control unit 30 conducts the general control of the plasma processing device 1 and the control of the processing units 2 and 3 for supplying or discharging gas. The general construction of the control unit 30 is illustrated in FIG. 3. Referring to FIG. 3, the control unit 30 includes an EC (equipment controller) 301 as a main controller; two module controllers 305a and 305b (hereinafter, referred to simply as "MC"), which respectively correspond to the processing units 2 and 3; a MC 306, which is provided in the wafer accessing chamber 8; and a switching hub 304, which connects the MCs 305a, 305b and 306 to the EC 301.

The MC 305a, connected to the processing unit 2, is a controller for controlling the processing conditions, such as the supply of high frequency electricity for exciting plasma, the supply or discharge of gas, etc., when performing a plasma etching process in the processing unit 2. In the same manner, the MC 305b connected to the processing unit 3 is a controller for controlling the processing conditions, such as the supply of electricity, the supply or discharge of gas, etc., when performing a plasma etching process in the processing unit 3.

Furthermore, the MC 306 connected to the wafer transfer device 16 is a controller for controlling the movement of the wafer transfer device 16, the generation or exhaust of downward air stream using the FFU 20 and the exhaust fan unit 21, and the electrification using the ion generator 19.

Further, additional MCs may be provided in the load lock chambers 6 and 7, and these extra MCs may be electrically unified by the EC 301. However, the illustration and description thereof are omitted herein.

The control unit 30 is connected, via a LAN (local area network) connected to the EC 301, to a host computer 501, which serves as an MES (manufacturing execution system) that controls the overall manufacturing process of a factory in which the plasma processing device 1 is installed. The host computer 501 feeds real-time information about the manufacturing process of the factory back into a basic control system (not shown) in conjunction with the control unit 30 and, simultaneously, controls the process in consideration of the load on output of the entire factory.

The EC 301 is the main controller, which synthesizes the MCs (such as the MCs 305a, 305b, 306, etc.) and thus controls the entire operation of the plasma processing device 1. The EC 301 includes a CPU (not shown), and a memory unit 303, including RAM or a HDD. The CPU reads a program, corresponding to a wafer processing method (that is, a recipe including a processing gas flow or pressure conditions) selected by the user through the user interface 502, from the memory unit 303 and transmits it to the MCs 305a and 305b to control the processing units 2 and 3.

Furthermore, the CPU of the EC 301 reads, from the memory unit 303, a control program of the transfer operation, which includes: the operation of carrying the wafers W into or out of the FOUPs F and the operation of carrying the wafers W into or out of the load lock chambers 6 and 7; and a program about the control of the ion generator 19, or a program about the control of the FFU 20 or the exhaust fan unit 21, and transmits it to the MC 306, such that the MC 306 can control the operation of carrying the wafers W or the electrification of the transfer pick 17.

The MCs 305a, 305b and 306 are connected to respective I/O (input/output) modules 308 through respective networks 309, each of which is realized by an LSI so called GHOST (general high-speed optimum scalable transceiver) networks. In each of the GHOST networks 309, the MC 305a and 305b serve as a master node, and the I/O module 308 serves as a slave node.

The I/O module 308, which is connected to each of the MCs 305a and 305b, includes a plurality of I/O parts 310 (in the drawing, four I/O parts are shown in each I/O module), which are connected to respective corresponding elements (end-devices) in the chamber of each of the processing units 2 and 3, and transmits signals for controlling the end-devices and signals output from the end-devices. For example, in FIG. 3, a mass flow controller (MFC) 53, a valve (VAL) 54, an exhaust device (EXHT) 56, a switch box (SW BOX) 313, etc., are shown as representative end-devices that pertain to the supply of gas or the control of pressure.

The I/O module 308, which is connected to the MC 306, includes a plurality of I/O parts 310 (in the drawing, four I/O parts are shown), which are connected to corresponding elements (end-devices) of the wafer accessing chamber 8, and transmits signals for controlling the end-devices and signals output from the end-devices. Here, for example, the wafer transfer device (TR) 16, the FFU 20, the exhaust fan unit 21, a switch box (SW BOX) 313 and the ion generator 19 are the representative end-devices of the wafer accessing chamber 8. In FIG. 3, for convenience of description, only the connection between some portions of the end-devices and the I/O parts 310 is representatively shown.

Each of the MCs 305a, 305b and 306 is configured such that various kinds of signals and alarms are exchanged through the corresponding I/O module 308. Therefore, for example, a status signal or an alarm signal is transmitted from each end-device to the corresponding I/O module 308 and is converted into a serial signal by the corresponding I/O part 310. The serial signal is transmitted to the switch box (SW BOX) 313 through a partial GHOST line via the switch (SW) 312.

Furthermore, an I/O board (not shown), which controls the input/output of digital signals, analog signals and serial signals of the I/O parts 310, is connected to the GHOST network 309.

The switching hub 304 switches the connection between the EC 301 and the MCs 305a, 305b and 306 depending on the control signal transmitted from the EC 301.

In the control unit 30 shown in FIG. 3, the end-devices are not directly connected to the EC 301, that is, the I/O parts 310 are connected to the respective end-devices constitute the I/O modules 308, which are connected to the EC 301 though the respective MC 305a, 305b and 306 via the switching hub 304. Therefore, communication system can be simplified.

Furthermore, each control signal, which is transmitted from the CPU of each of the MCs 305a, 305b and 306, includes the addresses of the I/O parts 310 connected to the desired end-device and the address of the I/O module 308 including the associated I/O parts 310. The GHOST of the MCs 305a, 305b and 306 refers to the addresses of the I/O parts 310 loaded in the control signal. Therefore, it is unnecessary for the switching hub 304 to refer to the CPU for information about a signal source, thus ensuring the reliable and smooth transmission of the control signal.

Preferably, the control unit 30 includes a data server 314, which serves as a data collecting and recording unit for efficiently collecting and recording data output from an end-device. In this case, a data signal outputted from the end-device is outputted as an analog signal and is inputted into the corresponding I/O part 310. Subsequently, the signal is inputted into the data server 314 via the GHOST network 309 or the LAN.

As such, in the plasma processing device 1, because the MCs 305a, 305b and 306 performs controlling under the control of the EC 301, which is the main controller, the operation of the end-devices can be reliably controlled.

In the plasma processing device 1 having the above-mentioned configuration, first, the wafer transfer device 16 pulls one wafer W out of one FOUP F in the wafer accessing chamber 8 under conditions of an atmospheric pressure of +1.3 Pa or more of clean air, puts the wafer W into the alignment chamber 14, and places the wafer W at a desired position. Thereafter, the wafer W is carried into one load lock chamber 6 or 7, and a vacuum state is created in the associated load lock chamber 6 or 7. Subsequently, the wafer W is carried into the associated processing unit 2 or 3 by the corresponding wafer transfer unit 4 or 5, and is then etched. The wafer W is thereafter carried into the associated load lock chamber 6 or 7 by the corresponding wafer transfer unit 4 or 5, so that it is again returned to a state of an atmospheric pressure.

The wafer transfer device 16, which is provided in the wafer accessing chamber 8, pulls the wafer W out of the associated load lock chamber 6 or 7 and places the wafer W into one FOUP F. This operation is repeated for each lot of wafers W, thus completing a process of processing one lot of wafers.

Figure 4:
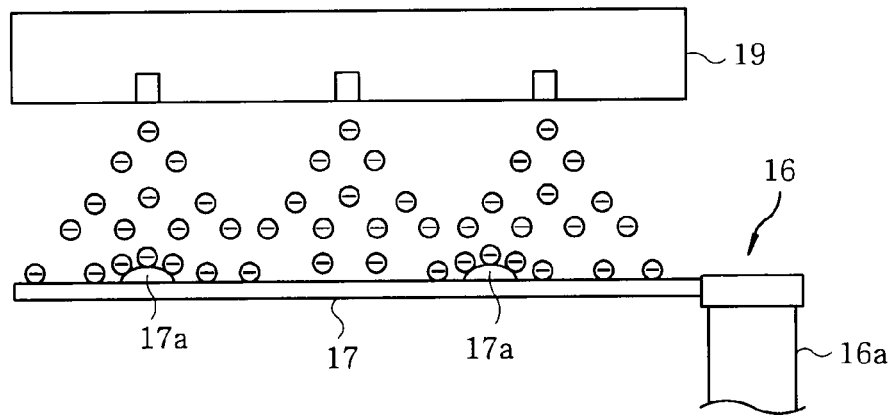
FIG. 4 illustrates the state of a contact member of a pick being charged with electricity in accordance with the embodiment of the present invention.

Meanwhile, after completing the process of processing a specific number of sheets of wafers W or a specific number of lots of wafers W, the operation of cleaning the transfer pick 17 of the wafer transfer device 16 is periodically performed. To conduct the cleaning operation, as shown in FIG. 4, the transfer pick 17 of the wafer transfer device 16 is moved to a position right below the ion generator 19. Thereafter, the ion generator 19 is turned on to supply charged particles to the transfer pick 17. In FIG. 4, negatively charged particles (negative ions) are supplied from the ion generator 19 to the transfer pick 17, so that the contact members 17a of the transfer pick 17 are charged with negative electricity. At this time, while the charging process is performed, a sensor (not shown) provided in the ion generator 19 monitors the charged state of the contact members 17a of the transfer pick 17, such that the contact members 17a of the transfer pick 17 have the desired polarity and are charged to the desired extent.

Because foreign particles adhered to the surfaces of the contact members 17a of the transfer pick 17 are typically in the negatively charged state, the foreign particles are removed from the contact members 17a by repulsive force when the contact members 17a are charged with negative electricity. Furthermore, positively charged particles may be supplied to the transfer pick 17 by the ion generator 17a. In this case, the contact members 17a of the transfer pick 17 are charged with positive electricity. Alternatively, the positively charged state and the negatively charged state may be alternately repeated.

Furthermore, while performing the cleaning process, air may be blown downwards by the FFU 20 and, simultaneously, the exhaust fan unit 21 may be operated to discharge the air that flows downwards. Then, the particles removed from the transfer pick 17 can be rapidly discharged from the wafer accessing chamber 8. As shown in FIG. 2, because the ion generator 19 is disposed below the path along which wafers W are carried and above the exhaust fan unit 21, the discharge of foreign particles can be facilitated by air that flows downwards. Therefore, the foreign particles removed from the transfer pick 17 are prevented from being dispersed in the wafer accessing chamber 8, thus preventing a possible secondary contamination.

Figure 5:
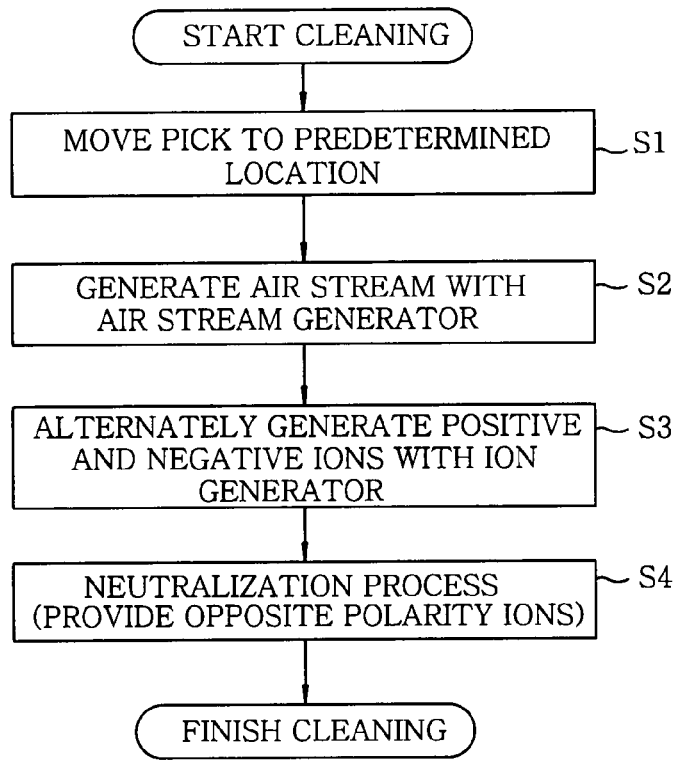
FIG. 5 is a flow diagram showing a processing order of a cleaning method in accordance with another embodiment of the present invention.

FIG. 5 is a flow diagram showing an example of a process of cleaning the transfer pick 17 in the plasma processing device 1. As shown in FIG. 5, in the plasma processing device 1 of the present invention, the cleaning operation can be performed by charging the contact members 17a of the transfer pick 17 with either positive or negative electricity. However, in a case where foreign particles are firmly adhered to the contact members 17a, the foreign particles may not be removed thoroughly by only a single electrifying operation. In this case, it is preferable that the cleaning operation be performed in the following manner.

In the plasma processing device 1, after the process of processing a specific number of sheets of wafers W or a specific number of lots of wafers W has been completed, at the step of carrying the processed wafers W into a FOUP F, a control signal, which commands the wafer transfer device 16 to stand by (to go into an idle state), is transmitted from the EC 301 of the control unit 30 to the MC 306. When this control signal is transmitted, the cleaning operation is performed under the control of the MC 306.

First, at step S1, the transfer pick 17 of the wafer transfer device 16 is moved to the desired cleaning position, for example, to a position right below the ion generator 19, as shown in FIG. 4. At step S2, the FFU 20 blows air downwards in the wafer accessing chamber 8 and, simultaneously, the exhaust fan unit 21 exhausts air outside the wafer accessing chamber 8. At step S3, the ion generator 19 is turned on to supply charged particles (ions) to the transfer pick 17. At this time, using a cleaning recipe program, which is read from the memory unit 303 of the EC 301 and is sent to the MC 306, the MC 306 controls the ion generator 19 such that positively/negatively charged particles are alternately supplied from the ion generator 19 to the transfer pick 17 at specific intervals. Then, the contact members 17a of the transfer pick 17 are charged with positive and negative electricity, alternately. At this time, while the charging process is performed, the sensor (not shown) provided in the ion generator 19 monitors the charged state of the contact members 17a of the transfer pick 17, such that the contact members 17a of the transfer pick 17 can have a desired polarity and are charged to a desired level. As such, foreign particles, which are adhered to the contact members 17a of the transfer pick 17, can be reliably removed from the contact members 17a by repeatedly alternating the positive and negatively charged states.

After performing the process of charging with positive/negative electricity for a specific time period (or a specific number of times), a neutralization process, in which charged particles, having polarity opposite the polarity of the charged particles that were most recently supplied, are supplied to appropriately adjust the charged state, is performed (step S4). If the cleaning operation is finished in the state in which the transfer pick 17 is charged with either relatively strong positive or negative electricity, a wafer W, when carried, may be undesirably adsorbed to the transfer pick 17.

Furthermore, in case the transfer pick 17 is in a powerful electrified state, particles having polarity opposite of that of the electrified transfer pick 17 are easily attracted to the transfer pick 17, thus contaminating the transfer pick 17. Therefore, at step S4, an appropriate amount of charged particles having polarity (for example, positive ions) opposite of the last charged state (for example, a negatively charged state) of step S3 is supplied to remove electricity from the transfer pick 17 including the contact members 17a. Here, in the neutralization process at step S4, it is unnecessary to completely remove electricity from the contact members 17a. For example, the contact members 17a may maintain a lightly negatively charged state so long as foreign particles cannot be adhered thereto after the neutralization process has been completed or when a wafer W is carried.

After the neutralization process has been completed, the cleaning process is completed. After the cleaning process has been completed, the wafer transfer device 16 remains in a stand-by state (an idle state) until the operation of processing a subsequent wafer W is commanded by the EC 301 of the control unit 30 through the MC 306. At this time, the cleaning operation is performed for the time during which the wafer transfer device 16 is in the stand-by state. Therefore, in the plasma processing device 1 of the present invention, the amount of downtime attributable to the cleaning operation can be reduced.

In the plasma processing device 1 according to the embodiment of the present invention, the ion generator 19 has been illustrated as being installed in the wafer accessing chamber 8, and the operation of cleaning the transfer pick 17 of the wafer transfer device 16 has been shown as being performed in the wafer accessing chamber 8. However, for example, as in a plasma processing device 100 shown in FIG. 6, the present invention may be configured such that a cleaning chamber 40 is provided at a position adjacent to the wafer accessing chamber 8 and an operation of cleaning the transfer pick 17 is thus performed outside the wafer accessing chamber 8. In the plasma processing device 100 of FIG. 6, the cleaning chamber 40 is provided on the outer surface of a sidewall of the wafer accessing chamber 8, which is opposite the alignment chamber 14. The ion generator 19 is provided in the cleaning chamber 40. To perform a cleaning operation, the wafer transfer device 16 is moved to a position adjacent to the cleaning chamber 40, and the arm 16a is then extended so as to invest the transfer pick 17 into the cleaning chamber 40. Subsequently, the cleaning operation is performed by charging the contact member 17a with electricity.

Furthermore, an FFU (fan filter unit) and an exhaust fan unit (not shown) are installed in the cleaning chamber 40, so that particles removed from the transfer pick 17 can be rapidly discharged outside the cleaning chamber 40 by air that flows downwards, in the same manner as that of the wafer accessing chamber 8. The general configuration of the plasma processing device 100 of FIG. 6, other than the above-mentioned structure, remains the same as the plasma processing device 1 of FIG. 1. Further, explanation thereon is, therefore, deemed unnecessary.

Figure 7:
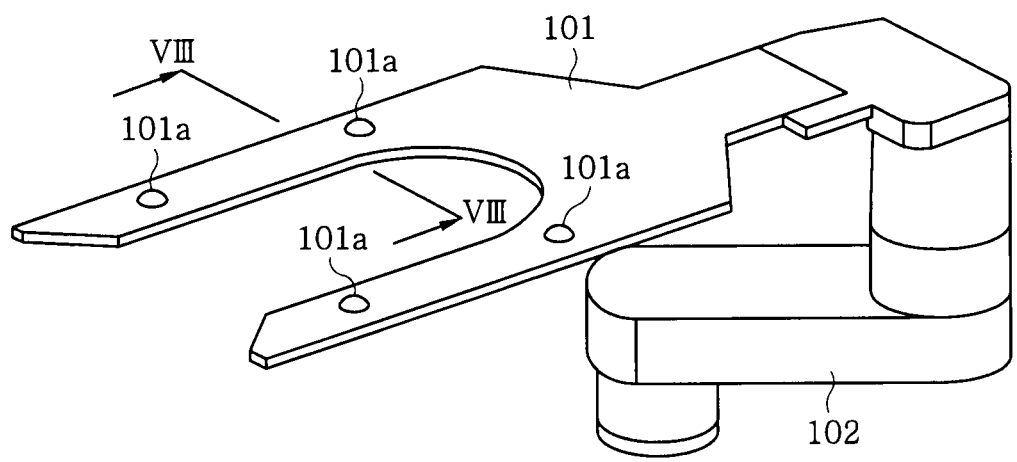
FIG. 7 is a perspective view illustrating an embodiment of a pick in accordance with the embodiment of the present invention.
Figure 8:
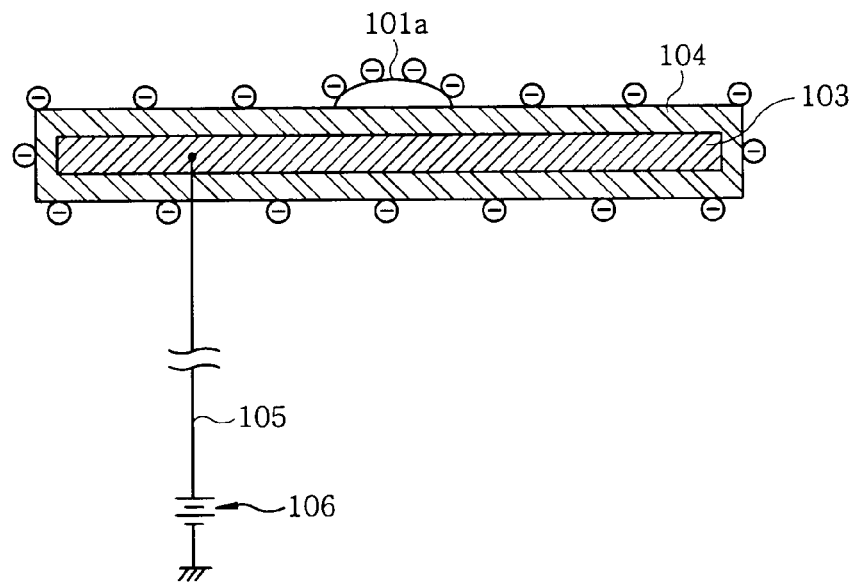
FIG. 8 is a sectional view taken along line VIII-VIII of FIG. 7.

FIG. 7 is an enlarged perspective view showing an embodiment of a transfer pick 101 of the wafer transfer device in accordance with the present invention. FIG. 8 is a sectional view taken along line VIII-VIII of FIG. 7. The transfer pick 101 is provided on the front end of an arm 102 of the wafer transfer device (not shown). A plurality of contact members 101a, for example, four contact members 101a, which contact a wafer W, are protruded from the support surface of the transfer pick 101 on which the wafer W is supported.

As shown in FIG. 8, the transfer pick 101 has a multi-layered structure such that a conductive member 103 is coated with an insulation member 104. The conductive member 103 may be formed by thermal spray coating using a conductive metal such as tungsten. Furthermore, the insulation member 104 may be formed by thermal spray coating using a ceramic such as alumina ($Al_2O_3$). The conductive member 103 is electrically connected to a DC power supply 106 via a power supply wire 105, which is provided in the arm 102.

The transfer pick 101 in accordance with the embodiment has a self-cleaning function for removing foreign particles or deposits adhered to the contact members 101a. The operation of cleaning the transfer pick 101 is performed by applying DC voltage having a specific polarity to the conductive member 103 from the DC power supply 106 via the power supply wire 105. The surface of the transfer pick 101, that is, the surfaces of the insulation member 104 and the contact member 101a, can be charged with electricity by applying voltage to the conductive member 103.

For cleaning, voltage is applied to the conductive member 103 such that the contact members 101a are electrified to have the same polarity as that of the foreign particles adhered thereto. In FIG. 8, voltage having positive polarity is applied from the DC power supply 106 to the conductive member 103, so that the surfaces of the contact members 101a and the insulation member 106 are charged with the same negative electricity as that of the foreign particles. As such, when the contact members 101a of the transfer pick 101 are charged with electricity, the particles adhered to the contact members 101a are by the repulsive force of the electric charge.

Furthermore, voltage having negative polarity may be supplied from the DC power supply 106 to the transfer pick 101 such that the contact members 101a of the transfer pick 101 are charged with positive electricity. Alternatively, the positively charged state and the negatively charged state may be alternately repeated, as described later herein.

The transfer pick 101 having the above-mentioned configuration may be used in the plasma processing device 1 of FIG. 1, instead of the transfer pick 17. Therefore, a description and illustration of the plasma processing device having the transfer pick 101 are deemed unnecessary. Furthermore, because the transfer pick 101 has the self-cleaning function, in the case where the transfer pick 101 is installed in the plasma processing device 1, the ion generator 19 may not be provided. To perform the cleaning operation, the transfer pick 101 is moved to a desired cleaning position, for example, to a position below the path along which wafers W are carried in the wafer accessing chamber 8 and above the exhaust fan unit 21. Subsequently, DC voltage having a specific polarity is applied from the DC power supply 106 to the conductive member 103 via the power supply wire 105.

Furthermore, during the cleaning process, air may be blown downwards by the FFU 20 and, simultaneously, the exhaust fan unit 21 may be operated to discharge the air that flows downwards. Then, the particles removed from the transfer pick 101 can be rapidly discharged from the wafer accessing chamber 8. In addition, because the cleaning operation is performed after the transfer pick 101 is moved below the path along which wafers W are carried, particles removed from the transfer pick 101 can be rapidly guided to the exhaust fan unit 21 by air that flows downwards. Therefore, the foreign particles are prevented from being dispersed in the wafer accessing chamber 8.

Figure 6:
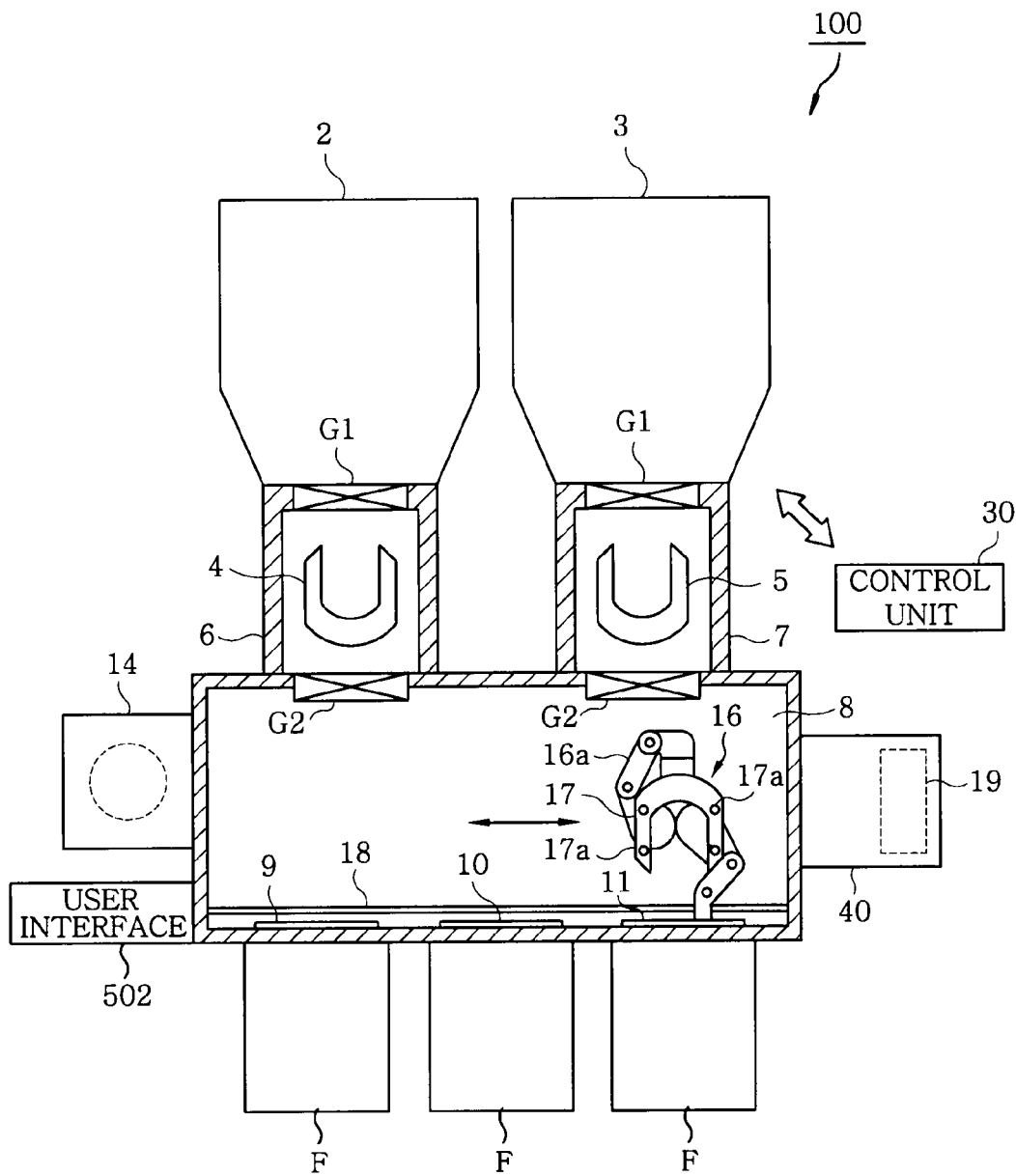
FIG. 6 shows the schematic construction of another embodiment of a plasma processing device in accordance with the embodiment of the present invention.

Furthermore, the transfer pick 101 in the plasma processing device 100 of FIG. 6, instead of the transfer pick 17 in accordance with the present embodiment may also be used. In this case, the transfer pick 101 is moved into the cleaning chamber 40, which is disposed adjacent to the wafer accessing chamber 8, and then the cleaning operation is performed. Here, since the transfer pick 101 has the self-cleaning function, it is obvious that the ion generator 19 need not be provided in the cleaning chamber 40.

In addition, the transfer pick 101 may be moved into either the load lock chamber 6 or 7 of FIG. 1 or 6, respectively, and then the cleaning operation may be performed. Because a purge gas supply unit (not shown) and an exhaust means such as a dry pump are provided in each of the load lock chambers 6 and 7, in which the vacuum state and the opened atmospheric state are repeatedly alternated, the particles removed from the transfer pick 101 by the cleaning operation can be rapidly discharged outside the load lock chambers 6 and 7 by gas which is supplied by the purge gas supply unit and then discharged outside the load lock chambers 6 and 7 by the exhaust unit. Therefore, during the operation of cleaning the transfer pick 101, a possible secondary contamination is prevented from occurring in the load lock chambers 6 and 7.

Figure 9:
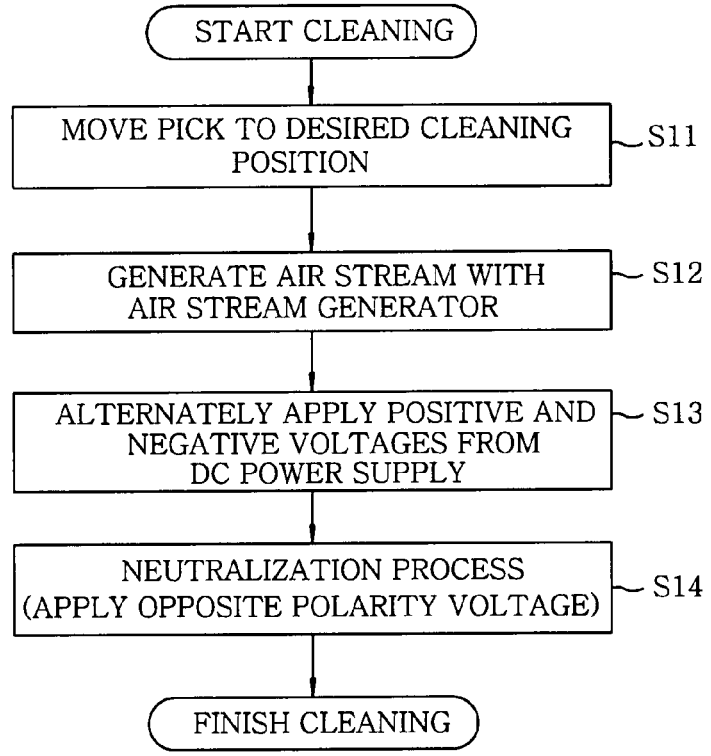
FIG. 9 is a flow diagram illustrating a processing order of a cleaning method in accordance with still another embodiment of the present invention.

FIG. 9 is a flow diagram illustrating an example of a process of cleaning the transfer pick 101. Here, in the case where foreign particles are firmly adhered to the contact members 101a, the foreign particles may not be removed thoroughly by only a single electrifying operation. In this case, it is preferable that the cleaning operation be performed in the following manner to reliably and more thoroughly clean the transfer pick 101. In the following description, it is assumed that the cleaning operation is performed in the plasma processing device 1, which has the same configuration as that of FIG. 1, except that the ion generator 19 is absent therefrom.

In the plasma processing device 1, after processing a specific number of sheets of wafers W or a specific number of lots of wafers W, at the step of carrying the processed wafers W into a FOUP F, a control signal, which requests the wafer transfer device 16 to stand by (to enter an idle state), is transmitted from the EC 301 of the control unit 30 to the MC 306. When this control signal is transmitted, the cleaning operation is performed under the control of the MC 306.

First, at step S11, the transfer pick 101 of the wafer transfer device 16 is moved to a desired cleaning position, for example, to a position below the path along which the wafer W is carried, and adjacent to an outlet of the exhaust fan unit 19. Thereafter, at step S12, the FFU 20 blows air downwards into the wafer accessing chamber 8 and, simultaneously, the exhaust fan unit 21 discharges air out of the wafer accessing chamber 8 to the outside.

At step S13, the DC power supply 106 is turned on, thus DC voltage is applied to the conductive member 103 of the transfer pick 101 through the power supply wire 105. At this time, using a cleaning recipe program, which is read from the memory unit 303 of the EC 301 and is sent to the MC 306, the MC 306 controls the DC power supply 106 such that a positive and a negative DC voltage are alternately supplied from the DC power supply 106 to the transfer pick 101 at specific interval. Then, the contact members 101a of the transfer pick 101 are alternately charged with positive and negative electricity. As such, foreign particles adhered to the contact members 101a of the transfer pick 101 can be reliably removed from the contact member 101a by alternately repeating the positive and the negatively charged state.

After the process of charging with positive/negative electricity has been performed for a specific time period (or a specific number of times), a neutralization process, in which charged particles, having polarity opposite of the polarity of the charged particles that were most recently supplied, are supplied to appropriately adjust the charged state, is performed (step S14). In case the cleaning operation is completed when the transfer pick 101 is charged with relatively strong electricity that is either positive or negative, the wafer W, when carried, may be undesirably adsorbed to the transfer pick 101. Furthermore, if the transfer pick 101 is in a powerfully electrified state, foreign particles having polarity opposite of that of the electrified transfer pick 101 are easily attracted to the transfer pick 101, thus contaminating the transfer pick 101. Therefore, at step S4, an appropriate amount of voltage having polarity (for example, positive voltage) opposite of the voltage (for example, negative voltage), which has been most recently applied to the transfer pick 101 at step S3, is supplied to remove electricity from the transfer pick 101 including the contact members 101a. Here, in the neutralization process at step S4, it is unnecessary to completely remove electricity from the contact members 101a. For example, the contact members 101a may maintain a lightly negatively charged state so long as foreign particles cannot be adhered thereto after the neutralization process has been completed or when a wafer W is carried.

After the neutralization process has been completed, the cleaning process is completed. After the cleaning process has been completed, the wafer transfer device 16 goes into a stand-by state (an idle state) until an operation of processing a subsequent wafer W is requested from the EC 301 of the control unit 30 through the MC 306.

At this time, the cleaning operation is performed during the time in which the wafer transfer device 16 is in the stand-by state. Therefore, in the plasma processing device 1 of the present invention, the amount of downtime attributable to the cleaning operation can be reduced.

Although several embodiments of the present invention have been disclosed for illustrative purposes, the present invention is not limited to these embodiments, and various modifications are possible. For example, in the above embodiments, although a plasma processing device that conducts a plasma etching operation has been described as a representative example of the present invention, the present invention is not limited to this, and can be applied to any device as long as the device is a substrate processing apparatus having a pick for supporting a substrate such as a wafer.

Furthermore, in the plasma processing device, the number of processing units and the arrangement thereof are not limited to those of FIG. 1 (or FIG. 6). That is, the present invention may be applied to multi-chamber type plasma processing devices having greater number of processing units. In addition, the transfer device for carrying substrates such as wafers W is not limited to the example of FIG. 1 (or FIG. 6). For example, a transfer device having two scalar arms may be used.

As well, the substrate to be held by the pick is not limited to a semiconductor wafer. For example, the present invention may be applied to a large pick to carry a large substrate such as a glass substrate for flat panel displays (FPDs).

The present invention can be effectively used in a substrate processing apparatus for carrying substrates using a pick in a process of manufacturing a semiconductor device.

While the invention has been shown and described with respect to the embodiments, it will be understood by those skilled in the art that various changes and modifications may be made without departing from the scope of the invention as defined in the following claims.

What is claimed is:

1. A transfer pick cleaning method for use in a substrate processing apparatus that includes a transfer pick provided at a leading end of a transfer arm of a transfer device for transferring a substrate, the transfer pick having: a substrate support surface to support the substrate thereon; a plurality of contact members protruding from the substrate support surface to make contact with the substrate; and a voltage applying unit for charging the contact members with electricity, the transfer pick cleaning method comprising the sequential steps of:

moving the transfer pick to a position that is below a path of the transfer pick when the substrate is carried by the transfer pick and that is adjacent to an outlet of an exhaust device being used for exhausting an inside of a chamber in which the transfer pick is provided;

a cleaning process of repeatedly and alternately applying a positive and a negative voltage to the contact members by using the voltage applying unit to forcibly charge the contact members such that an electric polarity thereof is repeatedly switched between a positive polarity and a negative polarity, wherein particles adhered to the contact members are removed by repulsive force of electric charges; and a neutralization process of controlling a charged state of the contact members to prevent adhering of the particles to the contact members after said cleaning process, the neutralization process comprising applying, with the voltage applying unit, a subsequent voltage having a polarity opposite to that of a previous voltage most recently applied to the contact members during said cleaning process.

2. A transfer pick cleaning method for use in a substrate processing apparatus that includes a transfer pick provided at a leading end of a transfer arm of a transfer device for transferring a substrate, the transfer pick having: a substrate support surface to support the substrate thereon; and a plurality of contact members protruding from the substrate support surface to make contact with the substrate, the transfer pick cleaning method comprising the sequential steps of:

moving the transfer pick to a position directly below an electric charging unit that is configured to supply charged particles to the contact members;

a cleaning process of forcibly charging the contact members with electricity by using the electric charging unit to repeatedly switch an electric polarity of the contact members between a positive polarity and a negative polarity, wherein particles adhered to the contact members are removed by repulsive force of electric charges; and a neutralization process of controlling a charged state of the contact members to prevent adhering of the particles to the contact members after said cleaning process, the neutralization process comprising supplying, with the electric charging unit, charged particles having a polarity opposite to that of previous charged particles most recently supplied to the contact members during said cleaning process.

3. The transfer pick cleaning method of claim 1, wherein the cleaning process is performed during a time period in which the transfer device of the substrate processing apparatus is idle.

4. The transfer pick cleaning method of claim 2, wherein the cleaning process is performed during a time period in which the transfer device of the substrate processing apparatus is idle.

5. The transfer pick cleaning method of claim 1, wherein, during the cleaning process, an air stream is generated by an air stream generator in the chamber in which the transfer pick is provided.

6. The transfer pick cleaning method of claim 2, wherein, during the cleaning process, an air stream is generated by an air stream generator in a chamber in which the transfer pick is provided.

7. The transfer pick cleaning method of claim 5, wherein the substrate processing apparatus includes:
 a vacuum processing chamber in which the substrate is processed;
 a transfer chamber having therein the transfer device to transfer the substrate into the vacuum processing chamber; and
 a load lock chamber provided between the vacuum processing chamber and the transfer chamber,
 wherein the cleaning process is performed in the transfer chamber or the load lock chamber.

8. The transfer pick cleaning method of claim 6, wherein the substrate processing apparatus includes:
 a vacuum processing chamber in which the substrate is processed;
 a transfer chamber having therein the transfer device to transfer the substrate into the vacuum processing chamber; and
 a load lock chamber provided between the vacuum processing chamber and the transfer chamber,
 wherein the cleaning process is performed in the transfer chamber or the load lock chamber.

9. The transfer pick cleaning method of claim 1, wherein the neutralization process controls the charged state of the contact members such that the electricity of the contact members is removed.

10. The transfer pick cleaning method of claim 2, wherein the neutralization process controls the charged state of the contact members such that the electricity of the contact members is removed.

11. The transfer pick cleaning method of claim 1, wherein the neutralization process controls the charged state of the contact members such that the contact members are charged with a low level of negative electricity.

12. The transfer pick cleaning method of claim 2, wherein the neutralization process controls the charged state of the contact members such that the contact members are charged with a low level of negative electricity.

13. A computer executable control program for controlling, when executed by a computer, a substrate processing apparatus to execute the transfer pick cleaning method of claim 1.

14. A computer executable control program for controlling, when executed by a computer, a substrate processing apparatus to execute the transfer pick cleaning method of claim 2.

15. A non-transitory computer readable memory medium storing a computer executable control program, wherein the control program, when executed by a computer, controls a substrate processing apparatus to execute the transfer pick cleaning method of claim 1.

16. A non-transitory computer readable memory medium storing a computer executable control program, wherein the control program, when executed by a computer, controls a substrate processing apparatus to execute the transfer pick cleaning method of claim 2.

17. The transfer pick cleaning method of claim 1, wherein the voltage applying unit is turned on and the cleaning process is performed after the exhaust device starts to discharge air in the chamber toward an outside of the chamber.

18. The transfer pick cleaning method of claim 2, wherein the electric charging unit is turned on and the cleaning process is performed after an exhaust device starts to discharge air in a chamber in which the transfer pick is provided toward an outside of the chamber.

19. The transfer pick cleaning method of claim 1, wherein the outlet of the exhaust device is located at a bottom of the chamber and wherein the substrate is not mounted on the transfer pick during the cleaning process.

* * * * *